United States Patent

Higuchi et al.

[11] Patent Number: 5,994,642
[45] Date of Patent: Nov. 30, 1999

[54] METHOD FOR PREPARING CDTE FILM AND SOLAR CELL USING THE SAME

[75] Inventors: Hiroshi Higuchi, Katano; Seiji Kumazawa, Kadoma; Takashi Arita, Hirakata; Akira Hanafusa, Hirakata; Mikio Murozono, Hirakata; Tetsuya Aramoto, Osaka, all of Japan

[73] Assignee: Matsushita Battery Industrial Co., Ltd., Osaka, Japan

[21] Appl. No.: 09/000,089
[22] PCT Filed: May 27, 1997
[86] PCT No.: PCT/JP97/01791
  § 371 Date: Mar. 13, 1998
  § 102(e) Date: Mar. 13, 1998
[87] PCT Pub. No.: WO97/45880
  PCT Pub. Date: Dec. 4, 1997

[30] Foreign Application Priority Data

May 28, 1996 [JP] Japan .................................. 8-132961
Apr. 28, 1997 [JP] Japan .................................. 9-110727
Apr. 28, 1997 [JP] Japan .................................. 9-110728

[51] Int. Cl.$^6$ .................................................. H01L 31/00
[52] U.S. Cl. .......................... 136/260; 136/264; 427/74; 427/76; 427/255.2; 438/761; 438/763
[58] Field of Search .................................... 136/260, 264; 427/74, 76, 255.2; 438/761, 763

[56] References Cited

U.S. PATENT DOCUMENTS 5,248,349 9/1993 Foote et al. .............................. 136/260
5,304,499 4/1994 Bonnet et al. ............................ 136/260

FOREIGN PATENT DOCUMENTS 50-79414   6/1975  Japan .
59-115569  7/1984  Japan .
6-45626    2/1994  Japan .
7-94769    4/1995  Japan .
7-147421   6/1995  Japan .

OTHER PUBLICATIONS

T.L. Chu et al., "High Efficiency Thin Film Cadmium Telluride Solar Cells", *11th E.C. Photovoltaic Solar Energy Conference*, pp. 988–990 (1992).

*Primary Examiner*—Mark Chapman
*Attorney, Agent, or Firm*—Akin, Gump, Strauss, Hauer & Feld, L.L.P.

[57] ABSTRACT

A method for forming a CdTe film of good quality by an improved close-spaced sublimation process is disclosed. This method comprises: a step of applying a paste which contains material for CdTe semiconductor on a supporting member, thereby to form a coating film which contains the material for the semiconductor on the surface of the supporting member; a step of closely arranging the supporting member and a substrate on which a CdTe film is to be formed, to make the coating film to face the surface of the substrate; and a step of forming a CdTe film on the substrate, by heating the coating film and the substrate, and causing the material for the semiconductor in the coating film to evaporate.

16 Claims, 5 Drawing Sheets

METHOD FOR PREPARING CDTE FILM AND SOLAR CELL USING THE SAME

TECHNICAL FIELD

The present invention relates to a method for preparing a CdTe semiconductor film which is used mainly for solar cells, in particular, to a method for preparing the CdTe film by a close-spaced sublimation process.

BACKGROUND ART

In recent years, global environmental problems such as global warming due to carbon dioxide, depletion of the ozone layer, and the like have been highlighted. For that reason, expectation for development of new energy, in particular, that for solar cells have become glowingly great. However, for popularization of the solar cells, there are a number of problems which must be solved. In particular, an improvement in conversion efficiency of the solar cells and a reduction in price are desired.

A CdS/CdTe solar cell uses CdTe which has an forbidden band gap (=1.44 eV) being suitable for a light absorption layer, and thus it is one of the solar cells which are expected to yield a high conversion efficiency.

In the manufacturing process of the CdS/CdTe solar cell, a cadmium telluride (CdTe) film is formed on a surface of a cadmium sulfide (CdS) film in general. As a method for forming the CdTe film, the close-spaced sublimation process which can produce the CdTe film of high quality is attracting attention. The close-spaced sublimation process is a kind of the vapor deposition process. A CdTe solar cell which has a conversion efficiency of the world highest level (15.8%) at present is obtained by this process. The close-spaced sublimation process is disclosed in, for instance, "HIGH EFFICIENCY CdS/CdTe SOLAR CELLS FROM SOLUTION-GROWN CdS FILMS" (The Conference Record of the 22nd IEEE Photovoltaic Specialists Conference (1991) Vol. 2, p.952) by T. L. Chu et. al., or the like. According to this process, a material for forming the CdTe film (hereinafter referred to as a source) and a substrate are so placed as to face each other, with a gap of about 0.5–5 mm, and heated under a reduced pressure. In this manner, the source is caused to sublime and then deposit on the substrate.

According to this process, since the sublimed source is rearranged and crystallized on the substrate placed at a short distance as long as the mean free path level, a CdTe film which has a high crystallinity is obtained. Further, since the treatment is performed under the reduced pressure, the film-forming speed is high.

However, the above-mentioned conventional close-spaced sublimation process has the following problems.

In general, in the close-spaced sublimation process, as a source, a CdTe powder placed on a dish-shaped container so as to cover over it is used. In the above-mentioned literature for instance, a commercially-available polycrystal of CdTe with a purity of 5N, or a powder produced by pulverizing a polycrystal ingot of CdTe obtained by directly implanting a dopant as one of the constituting element, is used as the source.

In addition to the fact that this process uses an expensive CdTe powder, it has a low utilization efficiency. In this process, it is difficult to evenly place as much amount of the source for forming the film just once for covering over the container. For that reason, the same source is repeatedly used for forming the CdTe films. It is difficult to control the CdTe powder or the source since it changes in particle size, powder density, stoichiometric ratio and the like by the sublimation, and hence, with the repetition of the film-forming, dispersions in thickness and in quality of the CdTe film increases gradually. Therefore, the obtained solar cell has a large dispersion in performance. For that reason, in order to make the dispersion in performance of the solar cell small, of the source placed for covering, only about 10% is actually consumed for the film-forming, and the rest is discarded without being used.

Further, according to this process, since the film is formed under the reduced pressure, an equipment must once be stopped when the source is exchanged. Therefore, the production efficiency is also low.

When a CdTe film is formed by this process, on a substrate which has a large area, a central part of the obtained CdTe film is made thicker than that of a peripheral part because the central part of the source is liable to trap a heat flowed from circumference, as opposed to the peripheral part where the heat is liable to escape. Therefore, the variation in thickness within the same film is large.

Moreover, according to this process, when the source is used repeatedly, the particle diameter of the material decreases gradually and the surface area of the material increases, and in addition, the surface temperature of the source rises because the particles combine together by sintering. Therefore, the thermal conductivity increases and the film-forming speed increases gradually. When the same source is used repeatedly still more and the remaining amount of the source decreases accordingly, pores are produced between and among the particles and the thermal conductivity of the source is gradually lowered, thereby to decrease the film-forming speed conversely. For that reason, even when the manufacturing is performed under the same conditions, the thickness of the obtained CdTe film varies for every film-forming processes.

As previously described, according to the conventional close-spaced sublimation process, it is difficult to obtain CdTe film having uniform quality and thickness within the same film and between a plurality of the films. For that reason, although the CdTe film theoretically has the forbidden band gap which is the most ideal for converting the solar light as a compound semiconductor, a CdTe film as an ideal p-type semiconductor has not actually been obtained by the conventional close-spaced sublimation process.

In order to improve the conversion efficiency of the CdTe solar cells, means of making the CdTe film a weak p-type one by diffusing copper or the like into the CdTe film from the electrode side has widely been used, as reported, for instance, by B. E. Mccandless et. al., in "A treatment to allow contacting CdTe with different conductors" (Conference record of the 24th IEEE photovoltaic specialists conference 1994 volume II, p. 107–110). However, according to this method, a solar cell having a satisfactory conversion efficiency has not been obtained.

DISCLOSURE OF THE INVENTION

The present invention intends to solve the above-mentioned conventional problems, and has, as its object, a provision of a method for preparing a CdTe film of good quality simply.

The method for preparing the CdTe film in accordance with the present invention comprises: a step of coating a paste containing a material for CdTe semiconductor on a supporting member thereby to form a coating film containing the material for the semiconductor on the surface of the supporting member; a step of closely arranging the supporting member and a substrate on which a CdTe film is to be formed, to make the coating film to face the surface of the substrate; and a step of forming a CdTe film on the substrate, by heating the coating film and the substrate, thereby to cause the semiconductor material in the coating film to evaporate.

According to this method, it is possible to greatly improve the utilization rate of the material as compared with the case of using the above-mentioned conventional source. That is, since a thin coating film can be formed by coating, the utilization rate of the source which has conventionally been about 10% can be improved to about 50%. For that reason, it is not necessary to use the source for the formation of the film repeatedly. That is, since the source can be made disposable and a new source can constantly be used for the film-forming, it is possible to suppress the dispersion in characteristics of the CdTe film due to the repeated use of the source. Further, since the thin source can be obtained, it is possible to form the CdTe film without giving an excessive thermal damage to the previously formed CdS film.

Moreover, it is preferable to use a mixture of a cadmium powder and a tellurium powder as the semiconductor material. By using the mixture of the cadmium powder and the tellurium powder or, preferably, the pulverized powder, which is very inexpensive as compared with the CdTe powder thereof, the material cost can be reduced in great deal. In particular, by pulverizing Cd and Te in a mixed state, a mixed power can be obtained in a short time period. Further, with an energy for the pulverization, a part of the mixture can be synthesized into CdTe.

Moreover, by adding cadmium chloride into the paste, the crystallinity of the formed CdTe film is improved and the grain size of CdTe increases. In this manner, it is possible to obtain a solar cell of a high conversion efficiency. It is believed that the improvement in the crystallinity of the CdTe film is due to the fact that position of lattice defect of tellurium is substituted by chlorine, thereby to improve the crystallinity of the CdTe film. Moreover, since cadmium chloride is mixed into a paste and then coated, it is possible to constantly use the new source wherein cadmium chloride is uniformly dispersed. Therefore, it is possible to repeatedly and stably manufacture a CdTe film of high quality. If the added amount of cadmium chloride is smaller than 0.1 wt %, great effect cannot be obtained for the improvement in the performance of the solar cell. In contrast, if it is larger than 1.75 wt %, the performance is deteriorated conversely. For that reason, the added amount of cadmium chloride is preferably 0.1–1.75 wt %, and particularly 0.3–1.0 wt %.

In addition, it is preferable that the paste is one with a Group I element or a Group V element incorporated therein. By incorporating an impurity which acts as a carrier into the paste, it is possible to control the carrier concentration of the CdTe film in simple means. Incidentally, use of the Group I element or the Group V element in the conventional process employing a source prepared by placing the semiconductor material of powder state in a container so as to cover over it causes a variation in composition of the source, if such films are formed for plural times by using the same source, due to the differences in the sublimation speeds of the semiconductor material and the impurities. Therefore, a semiconductor film of stable composition cannot be obtained. On the other hand, according to the present invention, since the coating film of the semiconductor material formed on the surface of a heat-resistant supporting member is used as the source, it is possible to use a very small amount of the semiconductor material as the source. Therefore, a semiconductor film which has a constant concentration of the impurity can be formed. It is preferable that the Group I element to be mixed is lithium, potassium, sodium, rubidium, copper, silver or gold. Further, it is preferable that the Group V element to be mixed is arsenic, antimony, bismuth, phosphor or nitrogen. These can be used singly or plurally.

Moreover, by adding to the paste a substance which is stable in composition against the heat applied at the time of forming the semiconductor film and remains on the supporting member after the heating, it is possible to place the semiconductor material of an amount which is exactly necessary for one time film-forming on the supporting member in a stable state with a small dispersion. By causing all semiconductor materials to sublime, it is possible to manufacture a CdTe film of large area which is stable in thickness and quality. For instance, according to a screen-printing, it is difficult to form a coating film of a uniform thickness unless the thickness of the coating film to be formed is not less than 50 $\mu$m. However, in a case of adding no additive to the paste, when a coating film with the thickness of 50 $\mu$m is entirely sublimed, a CdTe film with a thickness of about 20 $\mu$m is obtained. If such a thick CdTe film is used in the solar cell, resistance of the CdTe film in the thickness direction is large and thus the characteristics of the obtained solar cell are poor. That is, a thinner CdTe film is desired for employing it in the solar cell. The most suitable thickness is about 6 $\mu$m. That is, if no additive is added to the paste, it is necessary to stop the film formation halfway while the source remains. On the other hand, by adding an additive to the paste as in this example, the amount of the semiconductor material in the coating film can easily be adjusted and thus it becomes possible to form a semiconductor film which has a preferable thickness. Since to control the thickness of the coating film becomes so easy, it is possible to use only a necessary amount of the semiconductor material for one film formation as the source. As the substance to be added, carbon, silicon carbide, silicon dioxide, aluminum oxide, zirconium oxide, boron nitride, silicon nitride or aluminum nitride is preferable. Further, these substances can be used by mixing them. Since the carbon and silicon carbide can absorb radiated infrared ray, the source can be heated efficiently by using them. Moreover, since they can protect the CdS film which has previously been formed from a thermal damage, it is possible to suppress an occurrence of micro-short-circuiting resulting from a thinning of the CdS film by the sublimation, and an excessive mutual diffusion at an interface between the CdS film and the CdTe film.

Further, at the time of painting the paste, by making more amount of the paste adhere to the peripheral part of the supporting member where its temperature at heating is relatively lower than the central part of the supporting member, some more amount of semiconductor material may be placed there.

The supporting member for holding the paste is preferably a plate-shaped carbon material which has a heat soaking property and a small heat capacity. A glass substrate is preferable in viewpoints of price and easiness in handling. As the glass, borosilicate glass, a low alkali glass, soda-lime glass and the like may be used. In a case of using the glass substrate, it is preferable to place at least one carbon plate beneath the glass substrate. Further, if an expansion of the supporting member due to the thermal treatment is taken into consideration, a ceramics which has a small linear expansion coefficient is preferable. These supporting member can be used repeatedly.

It is preferable that the supporting member is composed of a glass having a conductive oxide film on the surface thereof. By using a glass having the conductive oxide film of, for instance, indium oxide, indium tin oxide, stannic oxide, zinc oxide and the like, as the supporting member, it is possible to suppress a radiation heat which reaches the formed semiconductor film, after the evaporation of the source is completed, thereby to prevent the excessive mutual diffusion at the interface of the CdS film and the CdTe film. Further, by roughening a surface of the supporting member which is opposite to the side where the paste is painted, the radiation heat can similarly be suppressed. In this case, by scatter due to an unevenness of the surface of the supporting member and an improvement in the heat absorbing property due to the increase in the surface area, it is possible to reduce the amount of infrared ray which transmits through the supporting member and reaches the formed semiconductor film.

THE BEST MODE FOR CARRYING OUT THE INVENTION

The method for preparing the CdTe film in accordance with the present invention will be described in detail with reference to the drawings.

Figure 1:
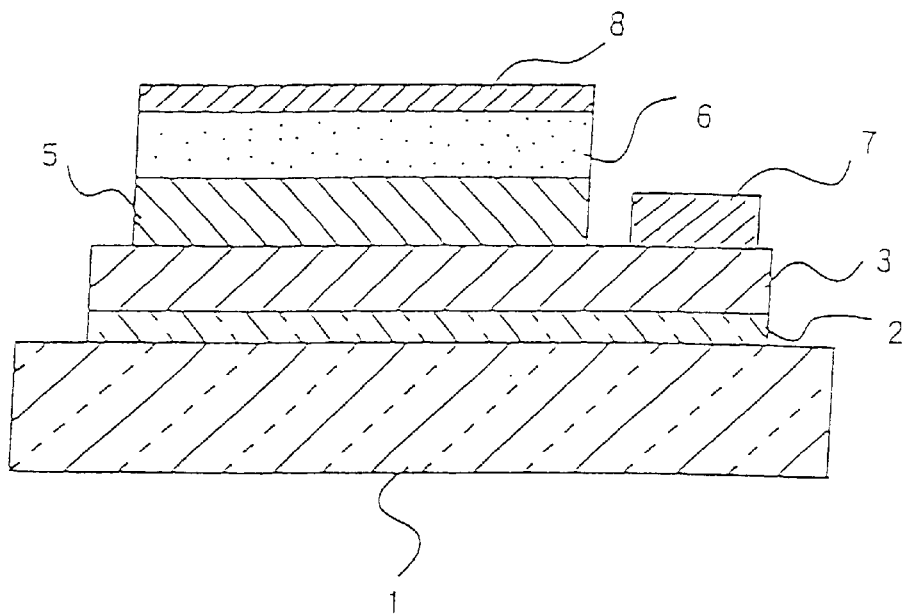
FIG. 1 is a schematic longitudinal cross-sectional view of a solar cell which uses CdTe film in accordance with one embodiment of the present invention.

In the following examples, a solar cell shown by FIG. 1 is produced by using the obtained CdTe film.

A transparent and insulating substrate 1 is made from borosilicate glass, low-alkaline glass, low-iron soda-lime glass, soda-lime glass and the like. On the surface of this substrate 1, a transparent conductive film 2 with a thickness of 1,000–10,000 Å composed of tin oxide, indium tin oxide (ITO) and the like is formed by chemical vapor-phase growing process or sputtering. In this occasion, a silica film ($SiO_2$ film) may sometime be formed between the substrate 1 and the transparent conductive film 2, in order to prevent an alkali component in the substrate 1 from diffusing into the transparent conductive film 2. Then, by forming a CdS film 3 with a thickness of 500–2,000 Å on the transparent conductive film 2 as an n-type semiconductor, a substrate 4 for forming CdTe film is obtained. This CdS film 3 is formed by thermally decomposing such an organometallic complex compound as cadmium isopropyl xanthogenate on the transparent conductive film 2.

In the followings, as examples of the method for preparing CdTe semiconductor film in accordance with the present invention, methods for forming a CdTe film 5 on the surface of the thus obtained CdS film 3 of the substrate 4 will be described.

EXAMPLE 1

By mixing a CdTe powder as a semiconductor material with propylene glycol as a viscosity improver, a paste was prepared. By printing the obtained paste on the glass substrate as the supporting member and drying, a film of the semiconductor material was formed on a glass substrate, thereby to obtain a source substrate 9.

Figure 2:
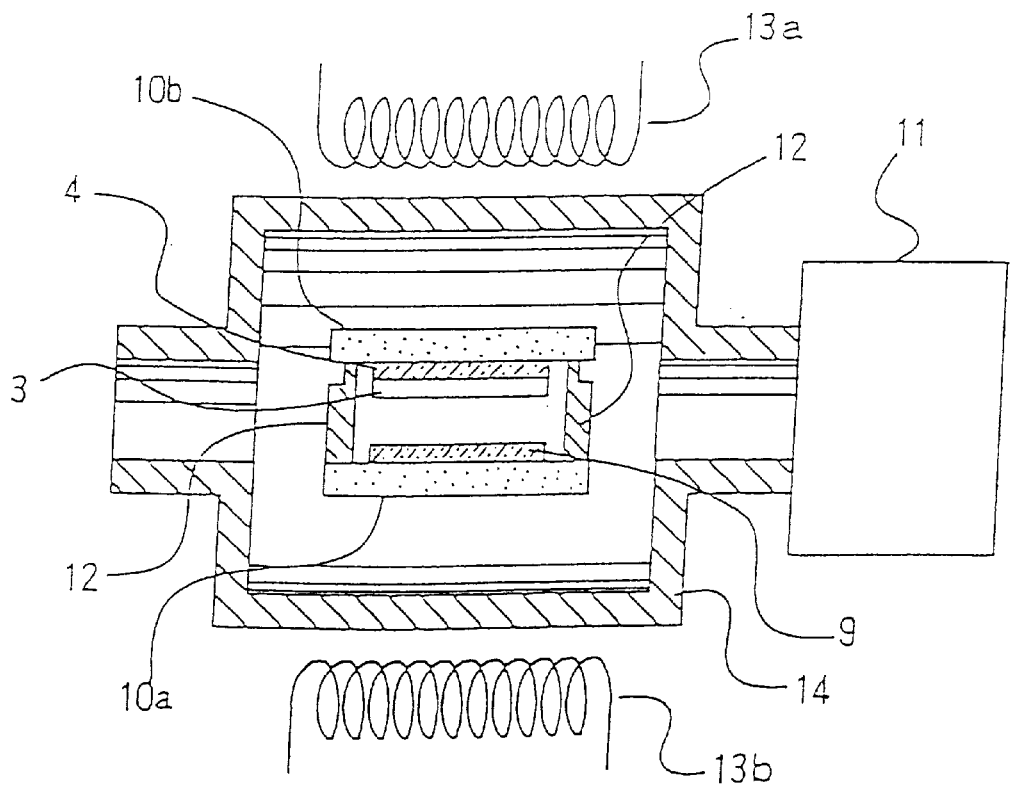
FIG. 2 is a schematic longitudinal cross-sectional view showing a structure of an equipment employed for forming the CdTe film in the same embodiment.

The obtained source substrate 9 and the substrate 4 were installed on a manufacturing equipment shown in FIG. 2, and the CdTe film 5 was formed on the surface of the substrate 4 in the following manner.

A chamber 14 is made of quartz tube, inside of which susceptors 10a and 10b made of carbon with a thickness of 1 mm are arranged as heat-soaking members. On the mutually confronting surfaces of the susceptors 10a and 10b, the source substrate 9 and the substrate 4 are arranged so as to make the semiconductor material film to face the CdS film 3, respectively. In that arrangement, a spacer 12 is disposed between the source substrate 9 and the substrate 4 so that the distance between the both is constant. The source substrate 9 and the substrate 4 may be disposed on the susceptors inversely, bottom to top.

By substituting the atmosphere inside the chamber 14 with an argon gas, and heating the source substrate 9 and the substrate 4 by lamp heaters 13a and 13b for 30 second to several minutes, while maintaining the pressure inside the chamber 14 to 1 Torr by aspirating with a rotary pump 11, a CdTe film 5 was formed on the CdS film 3 of the substrate. In this step, the temperature of the substrate 4 was kept to 400–650° C. by heating, and the temperature of the source substrate 9 was kept to a temperature which was higher than the temperature of the substrate 4 by 5–100° C.

In the above-mentioned manner, 100 pieces of samples wherein the CdTe films 5 were formed on the CdS films 3 of the substrates 4 were prepared. In this preparation, the sources were replaced for every samples. Further, about half of the source was consumed for forming the film.

On the surfaces of the CdTe films 5 of the respective samples thus formed, a methanol or an aqueous saturated solution of cadmium chloride was applied and then the applied methanol or water was evaporated. Further, the substrate 4 for thin film forming was thermally treated at 400° C. for 30 minutes. By this thermal treatment, grains in the CdTe film were grown.

A carbon paste was prepared by mixing a carbon powder and a solution obtained by dissolving polyvinylbutyral as a viscosity improver in diethylene glycol monobutyl ether with kneading. After applying this carbon paste on the surface of the CdTe film 5 by screen printing, it was dried and sintered, thereby to form a carbon electrode layer 6 as a current collector. On the other hand, a paste was prepared by mixing and kneading a mixed powder of silver and indium, an epoxide and an alcohol solution consisting mainly of terpineol. By applying the obtained paste on the surface of the CdS film 3 and carbon electrode layer 6 by screen printing, drying and then sintering, a + side electrode 7 and a − side electrode 8 were formed, respectively.

COMPARATIVE EXAMPLE 1

As a comparative example, a CdTe film was formed by using one obtained by filling the CdTe powder similar to that used in Example 1 in a dish-shape container as the source. In that case, the CdTe films were formed with the same source for a plurality of times. By this process, about 90% of the source was left after the formation of the CdTe films for 100 times. By using the obtained CdTe films, solar cells similar to those in Example 1 were produced.

Figure 3:
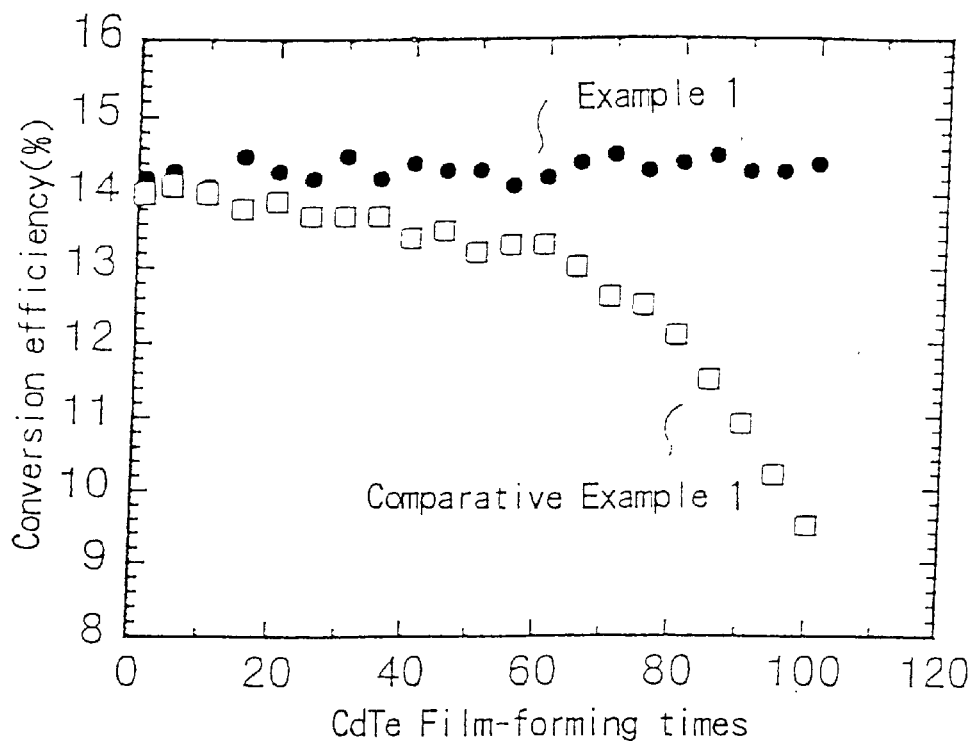
FIG. 3 is a characteristic diagram showing the relationship between the times of forming the CdTe film in the same embodiment and the conversion efficiency of a solar cell produced by using the CdTe film.

Each 100 pieces of the solar cells of Example 1 and of Comparative Example 1 obtained in the above-mentioned manner were investigated about their conversion efficiencies with a solar simulator at AM 1.5, 100 mW/cm$^2$. The results are shown in FIG. 3. In this diagram, the abscissa represents the respective solar cells arranged in the orders of forming the CdTe films.

As clearly seen from FIG. 3, according to the manufacturing method of Comparative Example 1, the composition of the source varies with the repetition of the manufacture of the film, thereby to change the quality and the thickness of the obtained CdTe film. Therefore, the characteristics of the cells prepared with these CdTe films deteriorated. In contrast, according to the manufacturing method of Example 1, it is possible to make a small amount of the source to be uniformly held on the glass substrate. By this method, the utilization rate of the material can greatly be improved as compared with the manufacturing method of Comparative Example 1, even if the source is replaced for every film formations. That is, by employing a source of the coating film obtained by making a semiconductor material a paste-state and painting this paste on a substrate, a constantly stable supply of the source is enabled. Therefore, a semiconductor film with a high quality can be manufactured stably at a low cost.

EXAMPLE 2

In this example, a description will be made in a case of adding cadmium chloride into the paste for forming the CdTe film beforehand.

A CdTe powder similar to that in Example 1 was used as a semiconductor material. Pastes were respectively prepared by adding cadmium chloride at a rate of from 0 to 2.0 parts by weight to 100 parts by weight of this CdTe powder.

By using the obtained pastes, CdTe films were formed and then, solar cells were prepared in a manner similar to that in Example 1.

Figure 4:
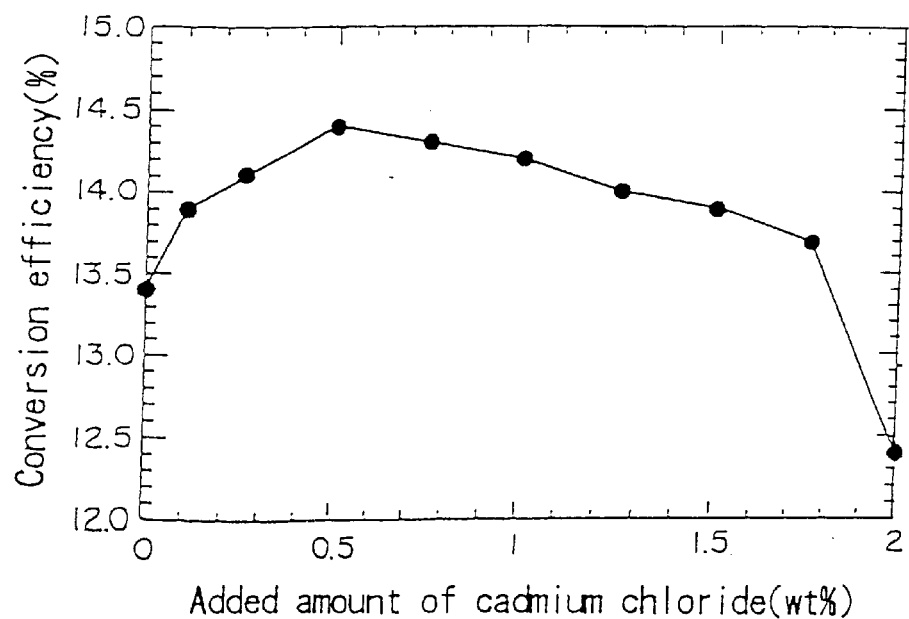
FIG. 4 is a characteristic diagram showing the relationship between added amount of cadmium chloride to the source and the conversion efficiency of a solar cell produced by using the obtained CdTe film in another embodiment of the present invention.

The relationship between the incorporation ratios of cadmium chloride to the CdTe powder and the conversion efficiency of the obtained solar cells are shown in FIG. 4.

As shown in FIG. 4, it is appreciated that by adding not less than 0.1 wt % of cadmium chloride to the CdTe powder, the conversion efficiency of the obtained cell is improved. However, if it is added in excess over 1.75 wt %, the conversion efficiency decreases. Therefore, the added amount of cadmium chloride is desirably 0.1–1.75 wt % to the CdTe powder. In particular, the improvement in the conversion efficiency is remarkable at 0.3–1.0 wt %, and vicinity of 0.5 wt % is the most desirable.

100 parts by weight of the CdTe powder was mixed with 0.5 parts by weight of cadmium chloride. By using the obtained mixture, a paste was prepared as mentioned above. By using a semiconductor film formed by painting this paste as the source, a CdTe film was formed. In this step, the source was replaced for every times of film forming in a similar manner to that in Example 1.

As a comparative example, a CdTe film was also formed by using the same mixture so placed in a dish-shape container as to cover over it at a high density. In this time, the source was used continuously for a plurality of times for the film formation without replacing.

Solar cells were produced by using the CdTe films obtained in the above-mentioned manner. The characteristics of the obtained solar cells were investigated in a similar manner. The results are shown in Table 1.

TABLE 1

| Film forming times (time) | Conversion efficiency (%) | |
|---|---|---|
| | Example 2 | Comparative Example |
| 1 | 14.6 | 13.6 |
| 20 | 14.5 | 13.5 |
| 40 | 14.7 | 13.2 |
| 60 | 14.5 | 12.5 |
| 80 | 14.5 | 11.3 |
| 100 | 14.6 | 8.5 |

As shown in Table 1, in the case of using the semiconductor material of powder state covering over the container, the characteristics of the semiconductor film decrease with the repeated times of the film forming. This is due to the above-mentioned varying in the cadmium chloride concentration and its non-uniformity. According to this method, it is difficult to form a CdTe film of good quality by using a small amount of the semiconductor material. That is, in any other means than discarding the source while consuming only a part of the source and leaving the remaining semiconductor material in a considerable amount, it is impossible to stably manufacture the CdTe film.

In contrast, according to the manufacturing method in accordance with this example, whereby the semiconductor material is made to have a paste-state, and the coating film obtained by applying the paste on the substrate is used as the source, the unevenness in the characteristics of the solar cells produced by using the obtained semiconductor film is small because there is no need for using the source repeatedly. Therefore, it is possible to stably manufacture the semiconductor film of a high quality at a low cost.

As the atmospheric gas, a similar effect is obtained in a case of using an inert gas such as nitrogen, hydrogen or helium gas in place of argon used in the above-mentioned example. In addition, in a film formation under a pressure of not more than 2 atm, a similar effect is also obtained.

EXAMPLE 3

By using a source of the coating film of the CdTe obtained by printing it as in Example 1, a CdTe film with a good quality can be formed. However, due to the fact that the CdTe powder as the raw material is very expensive, the price of the product becomes high. The reason for this is that the single crystal of CdTe is manufactured by Bridgman process in general. According to this process, in addition to the fact that heating at a high temperature of not less than 1,000° C. is required, a long period of time is required for elevating the temperature and cooling for the safety in operation and the improvement in the crystallinity.

Therefore, a description will be made, in this example, on a method for forming the CdTe film of a good quality, by using a starting material of a Cd powder and a Te powder which are inexpensive as compared with the CdTe powder. The price of the commercially available CdTe powder is about 250 yen/g but, in contrast, the prices of the commercially available Cd powder and Te powder are about 20 yen/g, respectively. Therefore, according to the manufacturing method of this example, the material cost can be reduced in great deal.

The Cd powder, the Te powder and a liquid (for instance, water) were mixed together and stirred by using a medium of ring-shape or spherical shape. Subsequently, a paste was prepared by adding propylene glycol to the obtained mixture after being dried. By using the paste thus obtained, a CdTe film was formed and a solar cell was produced in a manner similar to that in Example 1.

Figure 5:
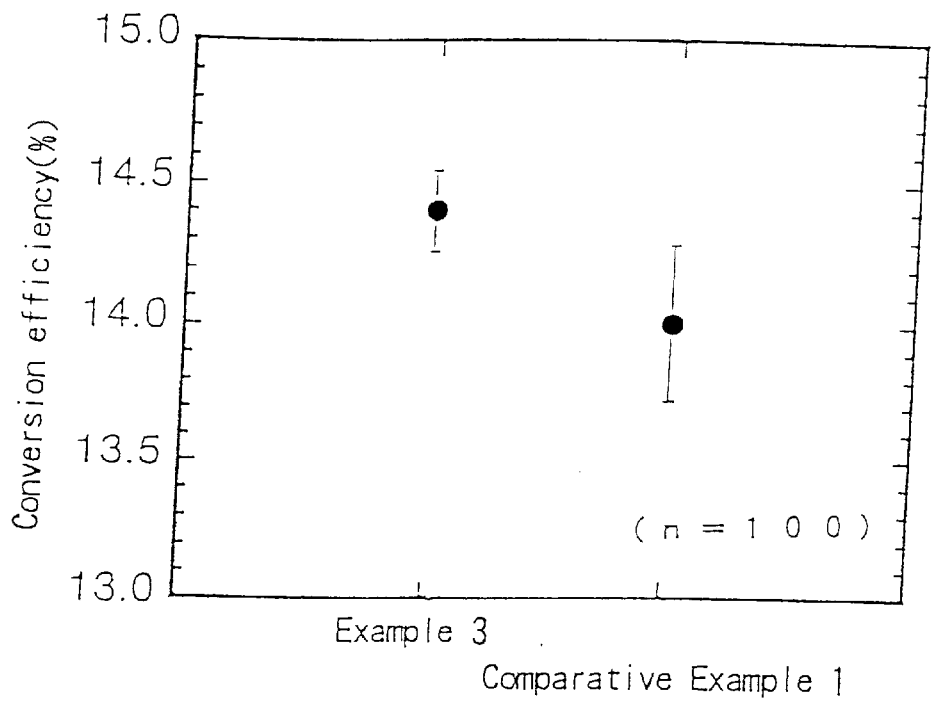
FIG. 5 is a characteristic diagram showing the dispersion in the conversion efficiency of a solar cell produced by using CdTe film obtained in a still other embodiment of the present invention.

The conversion efficiency of the obtained solar cell was measured in a manner similar to that in Example 1. The results thereof are shown in FIG. 5. In this diagram, the ordinate represents mean value ± standard variance in the conversion efficiencies of the solar cells of Example 3 and of the solar cells of Comparative Example 1.

As clearly shown by FIG. 5, according to the manufacturing method of this example, it is possible to obtain a solar cell of an excellent characteristic by using low-priced materials. As the reason for this, there are given the fact that the temperature distribution in the source can be made uniform since the particle diameters of Cd and Te can be made uniform by pulverizing, and the amount of the source can be made small by using the film obtained by applying the pulverized mixture as the source.

The Cd powder and the Te powder were mixed in an equimolar amount, and pulverized in water to give a particle diameter of not more than about 1 $\mu$m by using a medium stirring mill. After drying the pulverized powder thus obtained, propylene glycol as a viscosity improver was added to the pulverized powder and kneaded, thereby to prepare a paste. By printing this paste on a carbon plate with a thickness of 1 mm as the supporting member, and drying at 120° C. for 1 hour, a coating film was formed and a source substrate was obtained.

On investigating the composition of the formed coating film by X-ray diffraction, diffraction peaks of Cd single substance, Te single substance and CdTe were observed. It is believed that this CdTe is synthesized at the pulverization by the pulverizing energy.

This source substrate 9 and the substrate 4 were arranged so as to make the coating film to face the CdS film, with a gap of 2 mm. Thereafter, the atmosphere inside the chamber 14 was substituted by argon, the source substrate 9 and the substrate 4 were heated to temperatures of 600–630° C. and of 580–600° C., respectively, while maintaining the pressure to 1–5 Torr, and kept there for 1 minute. By this procedure, a CdTe film with a thickness of 6 $\mu$m was formed on the CdS film of the substrate 4.

An aqueous solution of $CdCl_2$ at a concentration of 0.3 mol/l was allowed to adhere to the surface of the obtained CdTe film, and then the water was evaporated. Thereafter, by thermally treating the CdTe film at 400° C. for 30 minutes, the crystallinity of the CdTe film was improved. Subsequently, a carbon film and an AgIn film were formed as an electrode of the CdTe film side and an electrode of the CdS film side, respectively, thereby to produce a solar cell.

The measurement on the characteristics of the obtained solar cell conducted with a solar simulator at AM 1.5, 100 mW/cm² revealed that the short-circuit current was 23.5 mA/cm² and the open-circuit voltage was 0.813 V. Further, the fill factor was 0.696 and the conversion efficiency was 13.3%. These characteristics are about the same degree as the characteristics of the solar cell of Comparative Example 1 produced by using the CdTe film formed by using the CdTe powder placed in the dish-shape container so as to cover over it (short-circuit current of 23.4 mA/cm², open-circuit voltage of 0.815 V, fill factor of 0.701 and conversion efficiency of 13.4%).

Next, a paste was prepared by adding an appropriate amount of $CdCl_2$ as a melting point depression agent in addition to propylene glycol as the viscosity improver to the pulverized powder similar to the above-mentioned. After printing the obtained paste on a carbon plate with a thickness of 1 mm, the paste was dried by drying at 120° C. for 1 hour, thereby to form a coating film comprising a semiconductor material, and to obtain a source substrate 9. In an X-ray diffraction pattern of the obtained coating film, a peak attributable to the $CdCl_2$ was observed in addition to the diffraction peaks of Cd single substance, Te single substance and CdTe, of course.

By heating the obtained source substrate 9 under a nitrogen atmosphere at a temperature of 600–700° C. for 1 hour, the coating film was sintered. In an X-ray diffraction pattern of the sintered film thus obtained, only the diffraction peak attributable to CdTe was observed.

Next, the source substrate 9 and the substrate 4 were so placed as to face each other, with a gap of 2 mm, and a CdTe film 5 was formed on the CdS film 3 in a procedure as shown above. After the formation of the CdTe film 5, an aqueous solution of $CdCl_2$ at a concentration of 0.3 mol/l was allowed to adhere to the CdTe film 5 and water was evaporated, and then, it was thermally treated at 400° C. for 30 minutes. Thereafter, a solar cell was produced in a procedure as shown above and the characteristics of the solar cell were evaluated in a similar manner. Measurements on the characteristics of the solar cell with a solar simulator at AM 1.5, 100 mW/cm² revealed that the short-circuit current was 23.6 mA/cm², and the open-circuit voltage was 0.816 V. Further, the fill factor and the conversion efficiency were found to be 0.699 and 13.5%, respectively. These values are the same degree as those of the solar cell of Comparative Example 1.

A film formed by painting a fine powder obtained by pulverizing Cd and Te singly or a CdTe compound and drying it, or a sintered film thereof obtained in the above-mentioned manner was used as the source to obtain a good quality CdTe film.

Incidentally, a similar effect is obtained by using a commercially-available CdTe as the starting material.

EXAMPLE 4

In this example, a description will be made on a method which employs the Cd and Te similar to those in Example 3 as the starting material, wherein cadmium chloride is further added to this mixture.

A muddy mixture was prepared by pulverizing the Cd and Te similar to those used in Example 3 in a wet process. Next, by drying the mixture and adding cadmium chloride and propylene glycol as the viscosity improver to this mixture, a paste was prepared. A CdTe film was formed by using the obtained paste and a solar cell was produced in a manner similar to that in Example 1.

The characteristics of the obtained solar cell were evaluated in a manner similar to those in the above-mentioned examples.

Figure 6:
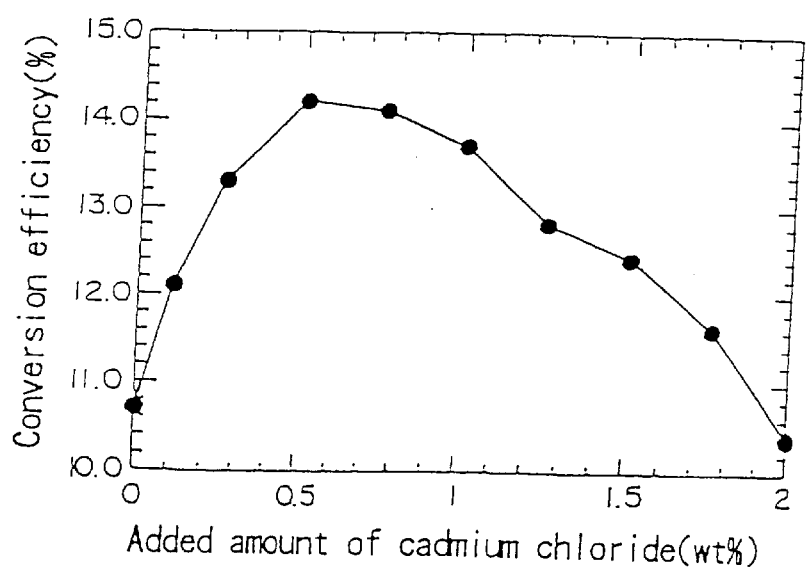
FIG. 6 is a characteristic diagram showing the added amount of cadmium chloride to the source and the conversion efficiency of a solar cell produced by using the obtained CdTe film in a still other embodiment of the present invention.

The added amounts of cadmium chloride to the sources and the conversion efficiencies of the solar cells produced by using the respective sources are shown in FIG. 6.

From FIG. 6, it is appreciated that by adding cadmium chloride in an amount of not less than 0.1 wt % for a sum of the weights of Cd and Te to it, the conversion efficiency is improved as compared with a case of not adding cadmium chloride. However, if cadmium chloride is added in an amount of more than 1.75 wt % for a sum of the weights of Cd and Te, the conversion efficiency decreases. Therefore, the added amount of cadmium chloride is desirably 0.1–1.75 wt %. In particular, the improvement in the conversion efficiency is remarkable in 0.3–1.0 wt %, and that in the vicinity of 0.5 wt % is the most desirable.

EXAMPLE 5

In this example, a description will be made on a method with an incorporation of a Group I element or a Group V element as a dopant into the source. According to this method, carrier concentration of the CdTe film can easily be controlled. The Group I element and/or the Group V element to be added is/are incorporated into it in a state of single substance or a compound such as organometallic compounds. These elements may be used singly or plurally.

On a surface of a substrate 1 with a thickness of 1.1 mm made from a borosilicate glass, a transparent conductive film 2 with a thickness of 500–5,000 Å composed of tin oxide was formed by a sputtering process. Next, a CdS film 3 with a thickness of 500–2,000 Å was formed by a CVD process. For the formation of the CdS film 3, any other process, for instance, a solution deposition method, may be employed.

A source substrate 9 provided with the source added with an impurity was arranged on a susceptor 12a in the lower side of the equipment. On the other hand, on a susceptor 12b in the upper side, a substrate 4 was arranged with a gap of 0.1 mm to several mm to the surface of the source. After substituting the atmosphere inside the chamber 14 with argon gas or nitrogen gas, by heating the substrate 4 in a temperature range of 400–800° C. and the source substrate 9 at a temperature higher than that of the substrate 4 and keeping them there for a certain time period, a semiconductor film was formed on the surface of the substrate 4.

In this step, although it is preferable to keep the pressure of argon gas or nitrogen gas to about 1–20 Torr, it is possible to form the film under 1 atm. In that case, it is preferable that the temperature difference between the substrate 4 and the source substrate 9 is not less than 50° C. In the case of forming the film under 1 atm, there is no need for making the chamber to have a pressure-resistant structure, and thus it is possible to simplify the equipment. Further, since a speeds in inlet and outlet of the substrate to and from the equipment can be made high, the productivity is greatly improved.

For the source, a paste is prepared by using the CdTe incorporated with antimony telluride at 0.01 wt %. By printing the obtained paste on a glass substrate and drying, the source substrate 9 was obtained.

By using the obtained source substrate 9, a CdTe film 5 was formed under the atmosphere of argon with a pressure of 1 Torr. In this step, by maintaining the substrate 4 in a temperature range of 400–650° C. and the source substrate 9 at a temperature higher by 30° C. than that of the substrate 4 for 2 minutes, the CdTe film 5 was formed on the CdS film 3.

Separately, a carbon paste was prepared by mixing and kneading a carbon powder with a solution of diethylene glycol monobutyl ether which dissolved polyvinyl butyral. The obtained carbon paste was applied on the CdTe film 5 by a screen printing process and sintered after being dried, to form a carbon electrode layer 6.

By mixing a mixed powder of silver and indium, and an epoxide with an alcohol consisting mainly of terpineol, and kneading the mixture, a paste was prepared. The obtained paste was applied on the CdS film 3 and the carbon electrode layer 6 by the screen printing process, which was then dried and sintered to form a + electrode 7 and a − electrode 8.

The CdTe films 5 were also formed in a similar manner by using each of arsenic, antimony, bismuth, phosphor, lithium, potassium, sodium, rubidium, copper, silver, gold, triphenylantimony, antimony octylate, triphenylbismuth, triphenylphosphine, triphenylphosphate, triphenylphosphite, triallylphosphine and triallylamine, in place of antimony telluride as the impurity to be incorporated into the CdTe paste. By using the respective CdTe films 5 thus obtained, solar cells were produced.

Further, as a comparative example, a solar cell employing a CdTe film prepared by using a CdTe paste with no additional impurity was produced as shown above and was similarly evaluated.

The relationships between the conversion efficiencies of the obtained solar cells and the carrier concentration of the CdTe films are shown in Table 2.

TABLE 2

| Impurity | Carrier concentration ($cm^{-3}$) | Conversion efficiency (%) |
| --- | --- | --- |
| Antimony telluride | $9.5 \times 10^{14}$ | 14.1 |
| Phosphor | $8.4 \times 10^{14}$ | 14.5 |
| Arsenic | $8.2 \times 10^{14}$ | 14.0 |
| Antimony | $8.1 \times 10^{14}$ | 14.2 |
| Bismuth | $8.2 \times 10^{14}$ | 14.1 |
| Lithium | $5.4 \times 10^{14}$ | 13.2 |
| Potassium | $8.1 \times 10^{14}$ | 14.0 |
| Sodium | $5.0 \times 10^{14}$ | 13.5 |
| Rubidium | $6.3 \times 10^{14}$ | 13.8 |
| Copper | $8.7 \times 10^{14}$ | 14.2 |
| Silver | $8.3 \times 10^{14}$ | 13.9 |
| Gold | $8.4 \times 10^{14}$ | 14.0 |
| Triphenylantimony | $1.2 \times 10^{15}$ | 14.5 |
| Antimony octylate | $1.4 \times 10^{15}$ | 14.6 |
| Triphenylbismuth | $1.3 \times 10^{15}$ | 14.4 |
| Triphenylphosphine | $1.8 \times 10^{15}$ | 14.7 |
| Triphenylphosphate | $1.7 \times 10^{15}$ | 14.7 |
| Triphenylphosphite | $1.8 \times 10^{15}$ | 14.6 |
| Triallylphosphine | $1.8 \times 10^{15}$ | 14.5 |
| Triallylamine | $1.6 \times 10^{15}$ | 14.2 |
| None | $3.5 \times 10^{14}$ | 13.0 |

From Table 2, it is appreciated that in the case of incorporating a Group I element or a Group V element into the source, the carrier concentration of the obtained CdTe film becomes higher and the conversion efficiency of the solar cell becomes higher as compared with the case of no incorporation.

EXAMPLE 6

A CdTe film was formed by the similar method as that in Example 5 except for the use of nitrogen in place of argon as the atmospheric gas. The conditions employed for forming the CdTe film 5 were that the pressure inside the chamber 14 was 1 atm, the substrate 4 was kept in a temperature range of 400–650° C., and the source substrate 9 was kept at a temperature higher by about 100° C. than that of the substrate 4 for 10 minutes, thereby to form a CdTe film 5. Further, a solar cell was similarly produced by using the obtained CdTe film 5.

Moreover, the CdTe films 5 were also formed by using each of arsenic, antimony, bismuth, phosphor, lithium, potassium, sodium, rubidium, copper, silver, gold, triphenylantimony, antimony octylate, triphenylbismuth, triphenylphosphine, triphenylphosphate, triphenylphosphite, triallylphosphine and triallylamine, in place of antimony telluride as the impurity to be incorporated into the paste, and by using the CdTe films 5 thus obtained, solar cells were produced.

The relationships between the conversion efficiencies of the obtained solar cells and the carrier concentrations of the CdTe films are shown in Table 3.

As a comparative example, a relationship between the conversion efficiency of a solar cell employing a CdTe film produced by using a CdTe paste with no additional impurity, and the carrier concentration of the CdTe film is also shown in Table 3.

TABLE 3

| Impurity | Carrier concentration ($cm^{-3}$) | Conversion efficiency of solar cell element (%) |
| --- | --- | --- |
| Antimony telluride | $8.2 \times 10^{14}$ | 14.1 |
| Phosphor | $8.4 \times 10^{14}$ | 14.7 |
| Arsenic | $7.1 \times 10^{14}$ | 14.2 |
| Antimony | $7.9 \times 10^{14}$ | 14.4 |
| Bismuth | $6.1 \times 10^{14}$ | 14.1 |
| Lithium | $5.4 \times 10^{14}$ | 14.0 |
| Potassium | $5.2 \times 10^{14}$ | 14.0 |
| Sodium | $4.9 \times 10^{14}$ | 13.8 |
| Rubidium | $5.8 \times 10^{14}$ | 14.1 |
| Copper | $8.5 \times 10^{14}$ | 14.7 |
| Silver | $7.1 \times 10^{14}$ | 14.1 |
| Gold | $8.2 \times 10^{14}$ | 14.4 |
| Triphenylantimony | $1.0 \times 10^{15}$ | 14.9 |
| Antimony octylate | $1.1 \times 10^{15}$ | 14.9 |
| Triphenylbismuth | $9.8 \times 10^{15}$ | 14.8 |
| Triphenylphosphine | $1.3 \times 10^{15}$ | 15.1 |
| Triphenylphosphate | $1.2 \times 10^{15}$ | 15.0 |
| Triphenylphosphite | $1.3 \times 10^{15}$ | 15.1 |
| Triallylphosphine | $1.3 \times 10^{15}$ | 15.1 |
| Triallylamine | $1.2 \times 10^{15}$ | 15.0 |
| None | $3.2 \times 10^{14}$ | 13.2 |

From Table 3, it is appreciated that in either case of incorporating a Group I element or a Group V element into the source material, the carrier concentration of the obtained CdTe film becomes higher and the conversion efficiency of the solar cell becomes higher as compared with the case of no incorporation.

EXAMPLE 7

A solution was prepared by dissolving cadmium isopropyl xanthogenate, which is an organometallic compound with a sulfur bond, in 1-methyl-2-pyrrolidone.

Figure 7:
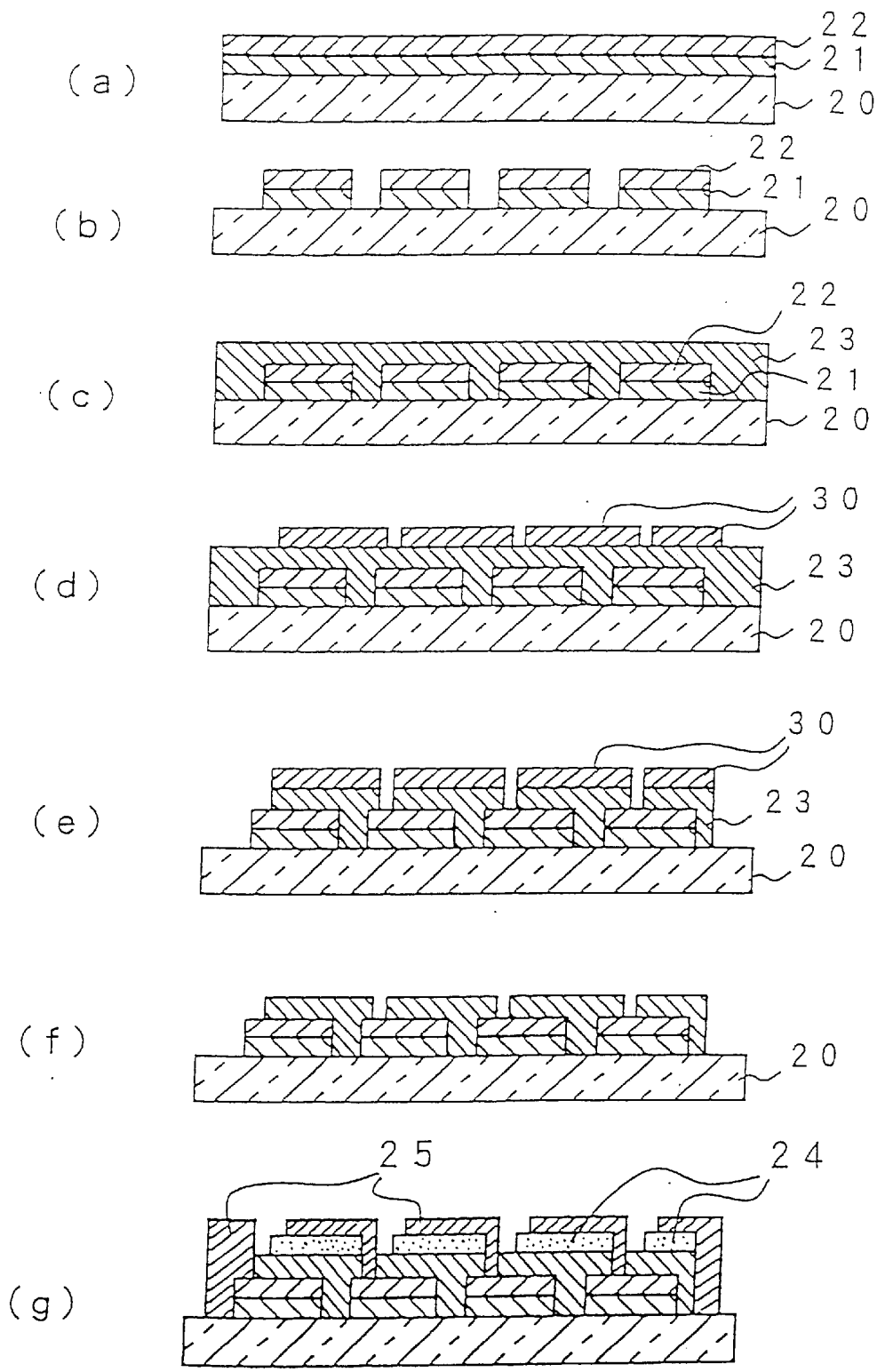
FIG. 7(a)–FIG. 7(g), each is a longitudinal cross-sectional view showing the state of the respective step in manufacture of the solar cell in another embodiment of the present invention.

Separately, on a glass substrate 20 (Corning #1737) with a length and a width of the same 35 cm shown in FIG. 7(a), a stannic dioxide film 21 with a thickness of about 600 nm was formed.

The solution obtained in the above-mentioned manner was painted on the surface of the stannic dioxide film 21 and dried at 110° C., thereby to evaporate the solvent. Thereafter, it was subjected to a thermal treatment in the air at 450° C. for 3 minutes, thereby to decompose the cadmium isopropyl xanthogenate and to form the CdS film 22. At this step, by adjusting the concentration of the solution thus used and the repeat times of the coating, the thickness of the CdS films 22 were set to 70 nm.

Thereafter, by a laser scribing process employing a YAG laser, a pattern for 42 cell series connection as shown by FIG. 7(b) was formed.

Subsequently, a mixed powder was obtained by mixing 1 g of graphite powder with a purity of 3N and a particle diameter of not more than 5 μm, with 6 g of CdTe powder with a purity of 5N.

The mixed powder thus obtained was placed on a glass substrate (Corning #1737) with a width and a length of 35 cm so as to cover over it, thereby to form a particle layer and to obtain a source substrate. Then, the source substrate and the substrate 20 were placed so as to make the particle layer to face the CdS film 22, with a gap of 2 mm. By heating the substrate 20 at 600° C. and the source at 630° C. under argon atmosphere with a pressure of 1 Torr for 2 minutes, CdTe films 23 with a thickness of about 6 μm were formed on the CdS films 22 as shown by FIG. 7(c). Thereafter, as shown by FIG. 7(d), etching resists 30 were applied on the surface of the substrate 20 by a screen printing process, and a thermal treatment was conducted in a dryer at 100° C. for 5 minutes.

Subsequently, after subjecting the substrate 20 to an etching process for 5 minutes by immersing it in nitric acid, the substrate 20 was immersed in a 10% solution of sodium hydroxide, thereby to fall the resist layer 30 off as shown by FIG. 7(f). Thereafter, the substrate 20 was immersed in a methanol saturated solution of cadmium chloride and dried, and then subjected to a thermal treatment in the air at 400° C. for 20 minutes. Thereafter, residue of the cadmium chloride was removed by ultrasonic-wave washing in pure water.

Subsequently, after forming a carbon film 24 which was added with a trace amount of copper on the surface of the substrate 20 by the screen printing process, it was dried and heated at 390° C. for 30 minutes, thereby to diffuse the copper into the CdTe films 23. Thereafter, silver-indium films 25 were formed by a similar screen printing process and thermal treatment, thereby to obtain a solar cell of 42 cells series connection as shown by FIG. 7(g).

EXAMPLE 8

On a glass substrate 20 (Corning #1737) with a length and a width of the same 35 cm, a stannic dioxide film 21 with a thickness of about 600 nm was formed. Next, in a manner similar to that in Example 7, a CdS film 22 with a thickness of 70 nm was formed on the surface of the stannic dioxide film 21. Thereafter, by a laser scribing process employing a YAG laser, the CdS film 22 was worked into a pattern for 42 cell series connection.

Separately, a paste was prepared by mixing 50 g of graphite powder with a purity of 3N and a particle diameter of not more than 5 μm, and 500 g of CdTe powder with a purity of 5N, with propylene glycol.

By applying the obtained paste on a glass substrate (Corning #1737) with a width and a length of the same 35 cm, and drying it in the air at 120° C. for 4 hours, a particle layer with a thickness of about 100 μm consisting mainly of CdTe was formed, thereby to obtain a source substrate.

The source substrate and the substrate 20 were placed so as to make the particle layer to face the CdS film 22, with a gap of 2 mm. By heating the substrate 20 at 600° C. and the source substrate at 630° C. under argon atmosphere with a pressure of 1 Torr for 2 minutes, the source in the particle layer was entirely sublimed, thereby to form a CdTe film 23 with a thickness of about 6 μm on the CdS films 22 as shown by FIG. 7(c). Thereafter, as shown by FIG. 7(d), etching resists 30 were painted on the substrate 20 by a screen printing process, and a thermal treatment was performed in a dryer at 100° C. for 5 minutes.

By using the obtained CdTe films 23, a solar cell similar to that of Example 7 was produced.

Further, by using powders of carbon black, silicon carbide, silicon dioxide, silicon nitride, aluminum oxide, boron nitride, zirconia, silicon nitride, and aluminum nitride, each of which has a purity of 3N and a particle diameter of not more than 5 μm, in place of graphite, solar cells were similarly produced.

EXAMPLE 9

On a glass substrate 20 (Corning #1737) with a length and a width of the same 35 cm, a stannic dioxide film 21 with a thickness of about 600 nm was formed. Next, in a manner similar to that in Example 7, a CdS film 22 with a thickness of 70 nm was formed on the surface of the stannic dioxide film 21. Thereafter, by a laser scribing process employing a YAG laser, the CdS film 22 was worked into a pattern for 42 cell series connection.

Separately, a paste was prepared by mixing 100 g of a graphite powder with a purity of 3N and a particle diameter of not more than 5 μm, and 500 g of a CdTe powder with a purity of 5N, with propylene glycol.

By applying the obtained paste on a glass substrate 100 (Corning #1737) with a width and a length of the same 35 cm, and drying it in the air at 120° C. for 4 hours, a particle layer consisting mainly of CdTe was formed, thereby to obtain a source substrate.

The source substrate and the substrate 20 were placed so as to make the particle layer 120 to face the CdS film, with a gap of 2 mm. By heating the substrate 20 at 600° C. and the source substrate at 630° C. under argon atmosphere with a pressure of 1 Torr, and until the CdTe on the source substrate was entirely evaporated (for 5 minutes), thereby to form a CdTe film 23 with a thickness of about 6 μm on the surface of the substrate 20.

By using the obtained CdTe film 23, a solar cell similar to that of Example 7 was produced.

EXAMPLE 10

On a glass substrate 20 (Corning #1737) with a length and a width of the same 35 cm, a stannic dioxide film 11 with a thickness of about 600 nm was formed. Next, in a manner similar to that in Example 7, a CdS film 22 with a thickness of 70 nm was formed on the surface of the stannic dioxide film 11. Thereafter, by a laser scribing process employing a YAG laser, the CdS film 22 was worked into a pattern for 42 cell series connection.

Separately, a paste was prepared by mixing 100 g of a graphite powder with a purity of 3N and a particle diameter of not more than 5 μm, and 500 g of a CdTe powder with a purity of 5N, with propylene glycol.

Figure 8:
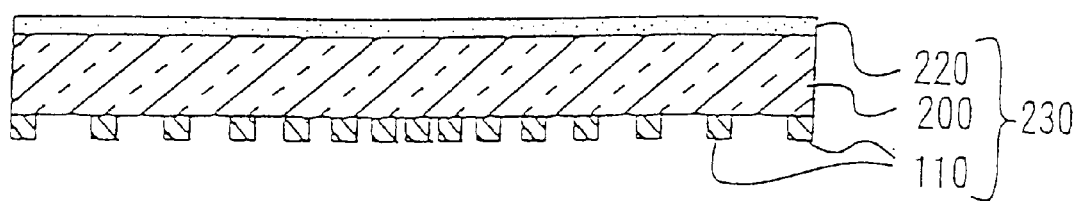
FIG. 8 is a schematic longitudinal cross-sectional view of source substrate plate used in another embodiment of the present invention.

After forming an indium oxide film on one surface of a glass substrate 200 (Corning #1737) with a width and a length of the same 35 cm, the indium oxide film 110 was removed by etching excepting the specified portion as shown by FIG. 8. In this step, a ratio occupied by the indium oxide films 110 in the central part of the surface was made higher than that in the peripheral part. On the surface of the other side of this glass substrate 200, the above-mentioned paste was painted and dried in the air at 120° C. for 4 hours, thereby to form a particle layer 220 consisting mainly of CdTe and to obtain a source substrate 230.

Then, the source substrate 230 and the substrate 20 which was similar to that used in Example 7 were placed so as to make the particle layer 220 to face the CdS film 22, with a gap of 2 mm. By heating the substrate 20 at 600° C. and the source substrate 230 at 630° C. under argon atmosphere with a pressure of 1 Torr, until all of the CdTe on the source substrate 230 was evaporated (for 5 minutes), thereby to form a CdTe film 23 with a thickness of about 6 μm.

By using the obtained CdTe film, a solar cell similar to that of Example 7 was produced. EXAMPLE 11

After roughening one surface of a glass substrate 200 (Corning #1737) with a length and a width of the same 35 cm by etching with hydrofluoric acid, a particle layer was formed on the other surface with the paste which was similar to that used in Example 10, thereby to obtain a source substrate.

By using the obtained source substrate, a CdTe film was formed, and a solar cell was produced in a manner similar to that in Example 8.

COMPARATIVE EXAMPLE 3

As a comparative example, a paste was prepared in a method similar to that in Example 8 excepting an addition of graphite. The obtained paste was applied in a manner similar to that in Example 8 in an amount just required for forming the CdTe film with a thickness of 6 nm. In that case, since it does not contain graphite, the amount of the paste to coat is required to be less as compared with Example 8 so as to adjust the thickness of the coating film to be formed to about 50 μm, but it is impossible to make the amount of the source and the thickness of the coating film uniform. Therefore, by applying the minimum amount for uniformly painting, a source substrate was produced. By using the source substrate, a CdTe film was formed in a manner similar to that in Example 8. In this step, although the thickness of the coating film was made uniform, the dispersion in the thickness of the obtained CdTe film was larger than that of the CdTe film obtained in Example 8. By using this CdTe film, a solar cell was produced in a manner similar to that of Example 8. This was named as the solar cell of Comparative Example 3.

On the solar cells of Example 7–11 and of Comparative Example 3, measurements of the open circuit voltage ($V_{oc}$) and fill factor (FF) which is a standard for the decision of good/bad of the output characteristic were conducted under condition of AM; 1.5, 100 mW/cm$^2$. The results thereof are shown in Table 4.

TABLE 4

|  | Additive | $V_{cc}$ (V) | FF (%) | η (%) |
| --- | --- | --- | --- | --- |
| Example 7 | Graphite | 31.8 | 57 | 9.6 |
| Example 8 | Carbon black | 33.0 | 61 | 10.1 |
|  | Graphite | 33.6 | 64 | 10.6 |
|  | Silicon dioxide | 32.7 | 59 | 9.8 |
|  | Aluminum oxide | 33.3 | 62 | 10.2 |
|  | Zirconium oxide | 31.0 | 58 | 9.7 |
|  | Boron nitride | 32.4 | 60 | 10.0 |
|  | Silicon nitride | 32.6 | 60 | 9.9 |
|  | Aluminum nitride | 32.0 | 57 | 9.7 |
|  | Silicon carbide | 33.0 | 60 | 10.0 |
| Example 9 | Graphite | 33.4 | 62 | 10.3 |
| Example 10 | Graphite | 33.2 | 63 | 10.4 |
| Example 11 | Graphite | 33.6 | 64 | 10.5 |
| Comparative Example 3 | None | 24.2 | 52 | 6.8 |

From Table 4, it is appreciated that the solar cells of Examples 7–11 employing the CdTe films which have been formed by using, as the source, a CdTe material added with a material which remains after the heating are excellent in every respect of the characteristics, as compared with the solar cell of Comparative Example 3. It is believed that this is due to the fact that by adding these materials, thermal damage of the CdS film attributable to the radiation heat can be prevented.

In particular, in the case of using graphite, carbon or silicon carbide in Example 8, or in Examples 9–11, by using the coating film of an amount just required for the film forming of one time as the source, it is possible to suppress an occurrence of an excessive heating of the substrate for thin-film forming, directly by the radiation heat, after the completion of the vaporization of the source. Tellurium, cadmium and cadmium telluride have a low absorption rate for infrared ray and a low heat conductivity. Therefore, if the source consisting of these semiconductor material is thick, since the temperature of the source is hardly elevated at the heating, the film forming speed is low, the infrared ray transmitted through the source is incident on the CdS film which has previously been formed on the substrate. Since the CdS which is typical as the n-type semiconductor for the solar cells has a very high absorption rate for infrared ray, it is heated by the incident infrared ray and made to be liable to vaporize. Therefore, when the CdS film is made thinner than the suitable thickness and when the vaporization of the CdS film further proceeds, pinholes are produced, thereby to invite micro-short-circuitings. For that reason, by using the infrared-absorption materials being mixed with the source as in these examples, the excessive temperature rise of the substrate is suppressed. Therefore, the mutual diffusion at a joint between the CdS film and the CdTe film is suppressed, thereby to obtain a solar cell which has a high open-circuit voltage and fill factor.

In addition, according to the method of the examples, since the source can be used exhaustively, the utilization rate of the material can greatly be improved. Although the CdTe film of good quality can also be obtained in Example 7 wherein a mixture of the source and the additive is used by filling it in a container as described above, it is limited to the cases where the times of repeatedly using the same source for forming the CdTe film are small. That is, according to this method, the change in the source cannot be avoided if the source is used repeatedly. Therefore, by using the coating film as the source as described in Examples 1–9, it is possible to obtain the CdTe film of good quality more effectively.

Further, measurements were made on the thickness distributions in the CdTe film formed in accordance with Example 8 and the CdTe film formed in accordance with Comparative Example 3. The results thereof are shown in Table 5. In this table, distance indicates a distance from the central part of the substrate in the diagonal direction.

TABLE 5

| Distance (mm) | Example 8 ($\mu$m) | Comparative Example 3 ($\mu$m) |
|---|---|---|
| 0 | 6.5 | 10.4 |
| 25 | 6.5 | 10.2 |
| 50 | 6.4 | 10.0 |
| 75 | 6.3 | 9.5 |
| 100 | 6.4 | 8.8 |
| 125 | 6.4 | 8.5 |
| 150 | 6.3 | 7.0 |
| 175 | 6.3 | 6.0 |

TABLE 5-continued

| Distance (mm) | Example 8 ($\mu$m) | Comparative Example 3 ($\mu$m) |
|---|---|---|
| 200 | 6.2 | 4.9 |
| 212 | 6.0 | 3.0 |

Moreover, the solar cells which employ the CdTe film obtained in accordance with Example 8 and the solar cells obtained in accordance with Comparative Example 3 were produced in trial, for each five lots, each of which contains 10 pieces, and the measurements were made on the film thickness of CdTe and the solar cell characteristics The results thereof are shown in Table 6.

TABLE 6

| lot | Example 8 (Graphite) | | | | | Comparative Example 3 | | | | |
|---|---|---|---|---|---|---|---|---|---|---|
| | 1 | 2 | 3 | 4 | 5 | 6 | 7 | 8 | 9 | 10 |
| 1 | 6.5 | 6.8 | 6.4 | 6.7 | 6.0 | 6.0 | 8.5 | 5.0 | 9.9 | 6.2 |
| | 10.0 | 9.8 | 9.8 | 10.5 | 9.4 | 8.0 | 7.2 | 8.2 | 7.5 | 8.1 |
| 2 | 6.4 | 6.6 | 6.5 | 6.9 | 6.2 | 7.0 | 9.0 | 5.9 | 10.0 | 6.9 |
| | 9.9 | 9.9 | 10.0 | 9.5 | 9.1 | 8.5 | 6.9 | 8.8 | 7.3 | 8.2 |
| 3 | 6.7 | 6.7 | 6.3 | 6.2 | 6.8 | 6.5 | 7.6 | 6.5 | 9.1 | 6.5 |
| | 10.2 | 10.0 | 10.1 | 10.1 | 9.9 | 7.9 | 8.0 | 7.9 | 7.0 | 7.5 |
| 4 | 6.3 | 6.9 | 6.5 | 6.1 | 6.9 | 7.2 | 9.5 | 6.1 | 9.5 | 6.9 |
| | 10.1 | 9.8 | 9.9 | 9.7 | 9.6 | 6.9 | 7.0 | 5.9 | 6.9 | 8.5 |
| 5 | 6.6 | 6.7 | 6.7 | 6.9 | 6.2 | 5.3 | 8.7 | 5.1 | 8.7 | 6.8 |
| | 10.2 | 9.9 | 9.7 | 9.8 | 10.4 | 7.6 | 6.8 | 7.1 | 7.2 | 7.4 |
| 6 | 6.5 | 6.5 | 6.4 | 6.7 | 6.0 | 5.9 | 7.1 | 4.0 | 8.8 | 6.6 |
| | 9.9 | 10.1 | 9.5 | 9.7 | 10.2 | 9.2 | 5.9 | 6.9 | 6.1 | 7.8 |
| 7 | 6.7 | 6.9 | 6.5 | 6.5 | 6.9 | 7.8 | 6.6 | 4.9 | 7.9 | 6.0 |
| | 10.3 | 9.9 | 10.1 | 10.2 | 10.0 | 8.4 | 9.0 | 7.3 | 6.9 | 7.7 |
| 8 | 6.3 | 6.8 | 6.6 | 6.8 | 6.4 | 6.3 | 8.7 | 6.1 | 7.8 | 6.5 |
| | 10.0 | 10.0 | 9.8 | 10.5 | 9.3 | 8.6 | 6.4 | 7.5 | 7.0 | 6.3 |
| 9 | 6.6 | 6.7 | 6.7 | 6.7 | 6.8 | 6.9 | 7.5 | 5.9 | 10.0 | 6.8 |
| | 9.9 | 9.7 | 9.9 | 10.4 | 9.7 | 9.0 | 8.8 | 7.7 | 6.1 | 5.2 |
| 10 | 6.4 | 6.9 | 6.8 | 6.1 | 6.3 | 8.0 | 6.2 | 9.0 | 9.5 | 6.9 |
| | 10.3 | 9.8 | 9.6 | 10.1 | 9.5 | 7.1 | 6.5 | 8.1 | 6.8 | 8.1 |

Upper column: Thickness of CdTe film at central part of substrate ($\mu$m).
Lower column: Conversion efficiency (%).

The difference between the CdTe film of Example 8 and the CdTe film of Comparative Example 3 is only a presence/absence of the addition of graphite to the pastes. That is, as clearly shown from Table 5, by forming with a mixture of the source and the additive, a CdTe film with a stable thickness can be obtained.

Further, it is also appreciated from Table 6 that the CdTe film of Example 8 has a smaller dispersion in thickness within one lot and between the lots as compared with the CdTe film of Comparative Example 3. For that reason, according to Example 8, it is possible to stably obtain a solar cell of more excellent characteristics as compared with Comparative example 3.

As previously described, by using a source mixed with an additive, it is possible to suppress mutual diffusion at a joint between the CdS and the CdTe resulting from an excessive heating by a radiation, thereby to stably obtain a CdTe film of good quality.

As the additive, any stable substance which does not decompose or cause a chemical reaction on the supporting member at the time of heating can be used.

Further, by using a substrate which has an uneven structure on the surface opposite to the surface on which a particle layer is formed as in Example 11, it is possible to absorb the infrared ray by the uneven surface and a similar effect can be obtained.

On the other hand, according to Example 10, by lowering the proportion occupied by a transparent conductive film at the peripheral part of the substrate as compared with that of the central part, it is possible to make the temperature difference of the surface of the substrate small, by utilizing an action of the transparent conductive film to suppress the radiation of the infrared ray. According to this method, the dispersion in the thickness of the CdTe film formed on the surface of the substrate can be made small. A similar effect can also be obtained by directly piling a separate substrate which has a similar structure on a normal source substrate.

Further, in the above-mentioned examples, although CdS is employed as the n-type semiconductor for a solar cell, a similar effect can also be obtained in a case of using CdZnS. For forming these n-type semiconductors, a known method such as a process of thermally decomposing an organometallic compound, a liquid phase film-forming process, a close-spaced sublimation process, a vapor-deposition process, a sputtering process and the like can be employed.

As the transparent conductive film, indium tin oxide or zinc oxide can also be employed in place of tin oxide. For forming the transparent conductive film, a sputtering process, a chemical vapor-phase growing process, a vapor-deposition process or the like can be employed.

In the preciously-mentioned examples, although the glass substrate which has the transparent conductive film and the CdS film on the surface is used as a substrate for forming the CdTe, it is also possible to use, in place of this, any of semiconductor materials of cadmium zinc sulfide, gallium arsenide, indium gallium arsenide, indium gallium phosphor arsenide, zinc selenide, indium selenide, silicon, germanium, indium copper selenide, indium gallium copper selenide, gallium nitride and the like, and metals of iron, nickel, molybdenum and the like, as the substrate. As the substrate, a ceramic material can also be used in addition to the glass.

Further, although a description has exemplary been made on the method for forming the CdTe film, it can also be applied to a thin film formation of other semiconductors such as CdS, cadmium zinc sulfide, zinc selenide, indium selenide, indium copper selenide, indium gallium copper selenide, and the like.

As the viscosity improver used in preparing the paste, such another material as ethylene glycol, methyl cellulose or the like can also be employed, in addition to propylene glycol which was used in the above-mentioned examples.

POSSIBILITY OF INDUSTRIAL UTILIZATION

According to the present invention, it is possible to form a CdTe film of good quality in an inexpensive efficiently. The present invention can be embodied in the manufacture of semiconductor device such as a solar cell, an infrared ray receiving device, and an integrated circuit.

We claim:

1. A method for preparing a CdTe film comprising:
    a step of applying a paste containing a material for CdTe semiconductor on a supporting member, thereby to form a coating film containing said material for CdTe semiconductor on the surface of said supporting member,
    a step of closely arranging said supporting member and a substrate on which a CdTe film is to be formed, to make said coating film to face the surface of said substrate, and
    a step of forming a CdTe film on said substrate, by heating said coating film and said substrate, and causing said material for the semiconductor in said coating film to evaporate.

2. The method for preparing a CdTe film in accordance with claim 1, wherein said semiconductor material is a mixture of a cadmium powder and a tellurium powder.

3. The method for preparing a CdTe film in accordance with claim 1, wherein said paste contains cadmium chloride.

4. The method for preparing a CdTe film in accordance with claim 3, wherein the added amount of said cadmium chloride is 0.1–1.75 wt % to said semiconductor material.

5. The method for preparing a CdTe film in accordance with claim 1, wherein said paste contains a Group I element or a Group V element incorporated therein.

6. The method for preparing the CdTe film in accordance with claim 5, wherein said Group I element is at least one member selected from the group consisting of lithium, potassium, sodium, rubidium, copper, silver and gold.

7. The method for preparing a CdTe film in accordance with claim 5, wherein said Group V element is at least one member selected from the group consisting of arsenic, antimony, bismuth, phosphor and nitrogen.

8. The method for preparing a CdTe film in accordance with claim 5, wherein said Group V element is antimony, and is contained in said paste in a state of antimony telluride.

9. The method for preparing a CdTe film in accordance with claim 5, wherein said Group V element is contained in said paste in a state of at least one member selected from the group consisting of triphenylantimony, antimony octylate, triphenylbismuth, triphenylphosphine, triphenylphosphate, triphenylphosphite, triallylphosphine and triallylamine.

10. The method for preparing a CdTe film in accordance with claim 1, wherein said paste contains an additive of powder state which is stable in composition at the heating step.

11. The method for preparing a CdTe film in accordance with claim 10, wherein said additive is at least one member selected from the group consisting of carbon, silicon carbide, silicon dioxide, aluminum oxide, zirconium oxide, boron nitride, silicon nitride, and aluminum nitride.

12. The method for preparing a CdTe film in accordance with claim 1, wherein at the step of applying said paste, the painted amount of the paste in the peripheral part of said substrate is made to be larger than the painted amount of the paste in the central part of said substrate.

13. The method for preparing a CdTe film in accordance with claim 1, wherein said supporting member is at least one member selected from the group consisting of glass, ceramic material and carbon.

14. The method for preparing a CdTe film in accordance with claim 1, wherein said supporting member is glass having a conductive oxide film on the surface thereof.

15. The method for preparing a CdTe film in accordance with claim 1, wherein one surface of said supporting member that is opposite to the surface on which said paste is painted is rough.

16. A solar cell comprising: an insulating and transparent substrate, a transparent conductive film formed on said substrate, an n-type semiconductor film formed on said transparent conductive film, a p-type semiconductor layer formed on said n-type semiconductor film as a light absorbing layer, a current collector formed on said p-type semiconductor layer, a + side electrode electrically connected to said current collector, and a − side electrode electrically connected to said n-type semiconductor layer, wherein said p-type semiconductor film is a CdTe film formed by the method in accordance with claim 1.

* * * * *